(12) United States Patent
Toyota et al.

(10) Patent No.: US 10,542,622 B2
(45) Date of Patent: Jan. 21, 2020

(54) PRINTED WIRING BOARD

(71) Applicants: National University Corporation Okayama University, Okayama-shi, Okayama (JP); KYOCERA Corporation, Kyoto-shi, Kyoto (JP)

(72) Inventors: Yoshitaka Toyota, Okayama (JP); Kengo Iokibe, Okayama (JP); Xingxiaoyu Lin, Okayama (JP); Toshiyuki Kaneko, Hachioji (JP); Masanori Naito, Fuchu (JP); Toshihisa Uehara, Sagamihara (JP)

(73) Assignees: NATIONAL UNIVERSITY CORPORATION OKAYAMA UNIVERSITY, Okayama-Shi, Okayama (JP); KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 16/320,399

(22) PCT Filed: Jul. 20, 2017

(86) PCT No.: PCT/JP2017/026331
§ 371 (c)(1),
(2) Date: Jan. 24, 2019

(87) PCT Pub. No.: WO2018/021150
PCT Pub. Date: Feb. 1, 2018

(65) Prior Publication Data
US 2019/0274214 A1    Sep. 5, 2019

(30) Foreign Application Priority Data

Jul. 27, 2016  (JP) ................................. 2016-147671
Jan. 27, 2017  (JP) ................................. 2017-013647

(51) Int. Cl.
*G06F 1/26*      (2006.01)
*H05K 1/02*     (2006.01)
(Continued)

(52) U.S. Cl.
CPC ............ *H05K 1/0298* (2013.01); *G06F 1/26* (2013.01); *H05K 1/02* (2013.01); *H05K 1/0213* (2013.01);
(Continued)

(58) Field of Classification Search
CPC .. H05K 1/0298; H05K 1/0213; H05K 1/0236; H05K 3/46; G06F 1/26
See application file for complete search history.

(56) References Cited

U.S. PATENT DOCUMENTS

2008/0266026 A1*  10/2008  Han ..................... H01P 1/2005
                                                                      333/185
2009/0315648 A1   12/2009  Toyao
(Continued)

FOREIGN PATENT DOCUMENTS

CN      101667567 A    3/2010
CN      101714681 A    5/2010
(Continued)

*Primary Examiner* — Steven T Sawyer
(74) *Attorney, Agent, or Firm* — Volpe and Koenig, P.C.

(57) ABSTRACT

A printed wiring board of the present disclosure includes a power supply layer and a ground layer. A power supply layer pattern to be formed partially on the power supply layer includes a branch and a power supply layer electrode. The branch is a direct-current power feeding path for connecting adjacent electromagnetic band gap (EBG) unit cells, and the power supply layer electrode is connected through a slit provided along the branch. A capacitive coupling element disposed to oppose the power supply layer electrode with an interlayer being provided therebetween has a structure in which the EBG unit cells are disposed at regular intervals, the EBG unit cells being connected to the branch in the power supply layer pattern through a via.

8 Claims, 7 Drawing Sheets

(51) Int. Cl.
*H05K 3/46* (2006.01)
*H05K 1/11* (2006.01)

(52) U.S. Cl.
CPC ............. *H05K 1/0236* (2013.01); *H05K 3/46* (2013.01); *H05K 1/115* (2013.01)

(56) References Cited

U.S. PATENT DOCUMENTS

| | | |
|---|---|---|
| 2010/0085128 A1 | 4/2010 | Cho et al. |
| 2014/0028412 A1 | 1/2014 | Sasaki et al. |
| 2015/0084167 A1* | 3/2015 | Sasaki ..................... H01L 24/19 257/659 |
| 2016/0345429 A1* | 11/2016 | Ishiwata .............. H05K 1/0218 |

FOREIGN PATENT DOCUMENTS

| | | |
|---|---|---|
| JP | 2010-010183 A | 1/2010 |
| JP | 2013-058585 A | 3/2013 |
| JP | 2013-183082 A | 9/2013 |
| JP | 2013-255259 A | 12/2013 |
| JP | 2014-027559 A | 2/2014 |
| TW | 200808136 A | 2/2008 |

\* cited by examiner

PRINTED WIRING BOARD

TECHNICAL FIELD

The present disclosure relates to a printed wiring board having an electromagnetic band gap structure.

BACKGROUND ART

A multilayer printed wiring board having a noise suppression part or noise propagation suppression is considered to be used for suppressing parallel plate resonance or high-frequency noise propagation generated between a power supply layer and a ground layer in the multilayer printed wiring board. Normally a capacitor is used for reducing noises in a power supply system in the multilayer printed wiring board. On the other hand, an electromagnetic band gap (EBG) structure is used between the power supply layer and the ground layer in order to suppress noise propagation. Such printed wiring boards utilizing such an EBG structure are disclosed in, for example, Patent Documents 1 to 5.

RELATED ART DOCUMENT

Patent Document

Patent Document 1: Japanese Patent Application Laid-Open No. 2010-10183
Patent Document 2: Japanese Patent Application Laid-Open No. 2013-58585
Patent Document 3: Japanese Patent Application Laid-Open No. 2013-183082
Patent Document 4: Japanese Patent Application Laid-Open No. 2013-255259
Patent Document 5: Japanese Patent Application Laid-Open No. 2014-27559

SUMMARY OF THE INVENTION

A printed wiring board of the present disclosure includes a power supply layer and a ground layer. A power supply layer pattern to be formed in the power supply layer includes a branch that is a direct-current power feeding path connecting adjacent EBG unit cells, and a power supply layer electrode that is connected through a slit disposed along the branch. A capacitive coupling element that is disposed to oppose the power supply layer electrode with an interlayer being provided between the capacitive coupling element and the power supply layer electrode has a structure in which EBG unit cells to be connected to the branch of the power supply layer pattern through a via are disposed at regular intervals.

EMBODIMENT FOR CARRYING OUT THE INVENTION

In a capacitor used generally, a noise suppression effect cannot be expected at a few hundred or more MHz due to an influence of an equivalent series inductance (an ESL). Provision of an electromagnetic band gap (EBG) structure on a substrate is effective for the noise propagation suppression at a frequency equal to or more than 1 GHz. However, downsizing of the EBG structure is essential for practical use, and an EBG structure that uses an open stab that is easily downsized is reported. In this EBG structure, a via has to be formed in an interlayer between a power supply layer and a ground layer, and thus this structure is disadvantageous from a viewpoint of a cost. On the other hand, in general an EBG structure where a via is not formed in the interlayer between the power supply layer and the ground layer is hardly downsized.

The EBG structure provided to a printed wiring board of the present disclosure can be further downsized by forming a two-layer structure of a power supply electrode in which a capacitive coupling element is added to a power supply layer even if a via is not formed in the interlayer between the power supply layer and the ground layer. The printed wiring board of the present disclosure will be described in detail below.

Figure 1:
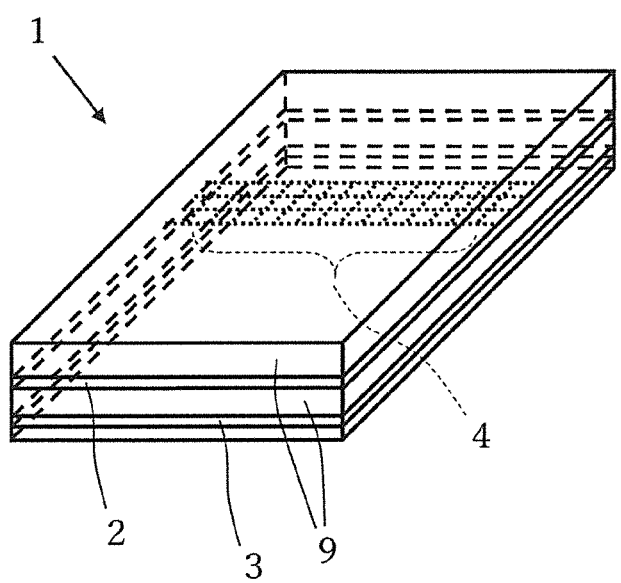
FIG. 1 is an explanatory diagram illustrating a printed wiring board according to one embodiment of the present disclosure.

A printed wiring board 1 according to one embodiment of the present disclosure includes, as illustrated in FIG. 1, a power supply layer 2 and a ground layer 3. The power supply layer 2 partially has an EBG structure 4. An insulating layer 9 is disposed between the power supply layer 2 and the ground layer 3. The power supply layer 2 and the ground layer 3 are formed by a solid pattern including an electrically conductive material such as copper. A thickness of the power supply layer 2 is not particularly limited, and for example, about 18 to 70 μm. A thickness of the ground layer 3 is also not particularly limited, and for example, about 18 to 70 μm.

The insulating layer 9 is formed on an upper surface of the power supply layer 2 and on a lower surface of the ground layer 3, namely, between the power supply layer 2 and the ground layer 3. The insulating layer 9 is not particularly limited as long as it is formed by an insulating material. Examples of the insulating material are organic resins such as an epoxy resin, a bismaleimide-triazine resin, a polyimide resin, and a polyphenylene ether resin. Two or more kinds of these organic resins may be mixed.

When the organic resin is used as the insulating material, a reinforcement material may be blended to the organic resin. Examples of the reinforcement material are insulating fabric materials such as a glass fiber, a glass nonwoven fabric, an aramid nonwoven fabric, an aramid fiber, and a polyester fiber. Two or more kinds of the reinforcement materials may be used. Further, the insulating material may include an inorganic filler such as silica, barium sulfate, talc, clay, glass, calcium carbonate, or titanium oxide.

The EBG structure 4 is configured by one-dimensionally disposing a plurality of EBG unit cells 41 in a direction along the branch at regular intervals or two-dimensionally disposing the plurality of EBG unit cells 41 also in a direction orthogonal to the direction along the branch at regular intervals.

The EBG structure 4 according to one embodiment will be described with reference to FIGS. 2(a) to 2(c). In the EBG structure 4 according to one embodiment illustrated in FIG. 2(a), the three EBG unit cells 41 are disposed in the direction along the branch, but a disposing form can be changed appropriately according to a usage pattern.

Figure 2A:
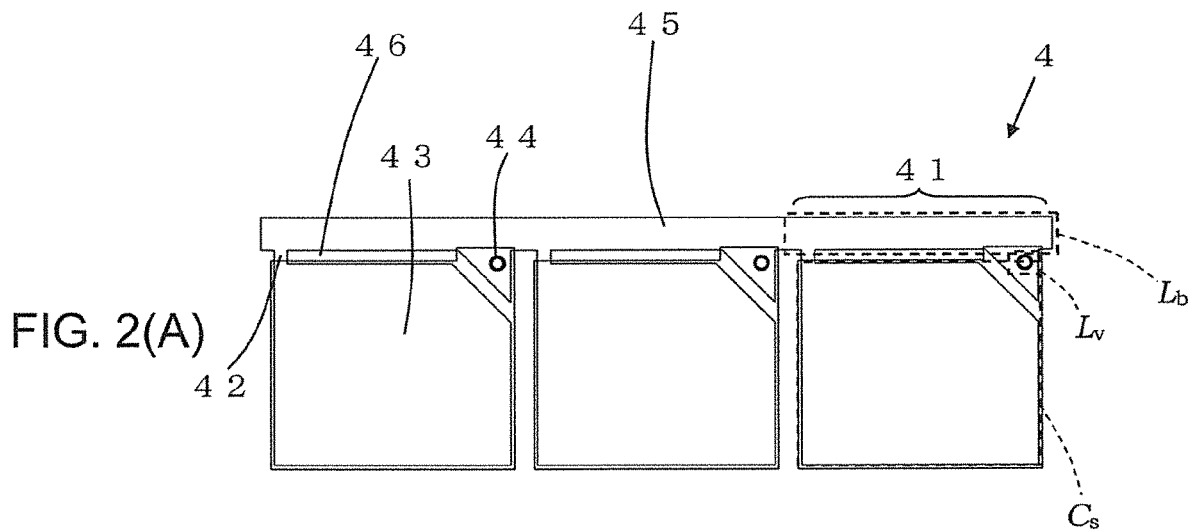
FIG. 2(a) is an explanatory diagram illustrating an EBG structure provided in the printed wiring board illustrated in FIG. 1 according to one embodiment.

In the EBG unit cells 41, as illustrated in FIG. 2(a), capacitive coupling elements 43 are disposed above a power supply layer pattern 42 with an interlayer being provided therebetween. Since the EBG unit cells 41 are disposed in the printed wiring board 1 at a design stage, a mounting cost after manufacturing the printed wiring board is not necessary differently from a noise suppression part. A shape of the EBG unit cells 41 is not particularly limited, but an approximately rectangular shape that achieves a less disposing space is preferable.

Figure 2B:
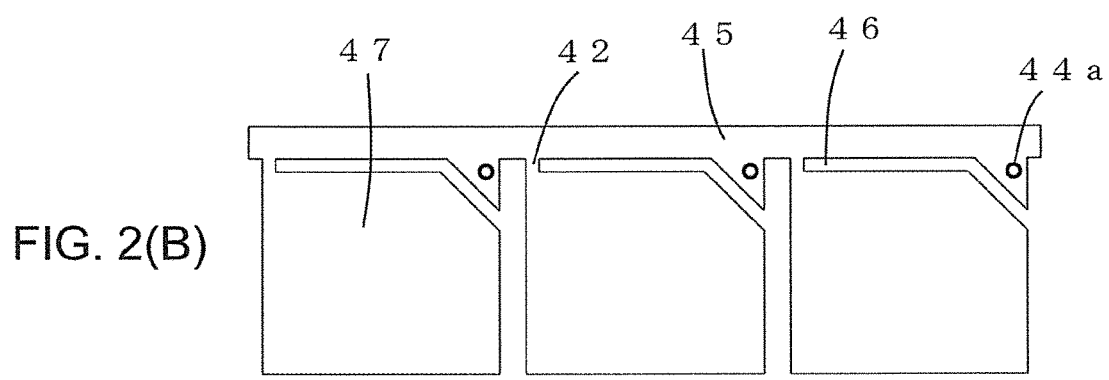
FIG. 2(b) is an explanatory diagram illustrating a power supply layer pattern included in the EBG structure.

The power supply layer pattern 42 is structured, as illustrated in FIG. 2(b), by connecting the adjacent EBG unit cells 41 through a branch 45 that is as thin as a direct current necessary for feeding power can be caused to flow. Power supply layer electrodes 47 are disposed to be connected at ends to the branch 45 across the slits 46. Further, the power supply layer pattern 42 has at least one via 44a that is connected to vias 44b of the capacitive coupling elements 43. Herein, the "ends" mean ends of sides of the power supply layer electrodes 47 opposing the branch 45 across the slits 46 in the EBG unit cells 41, specifically positions between ends (corners) opposite to the vias 44a and about one-eighths length of the sides.

Figure 2C:
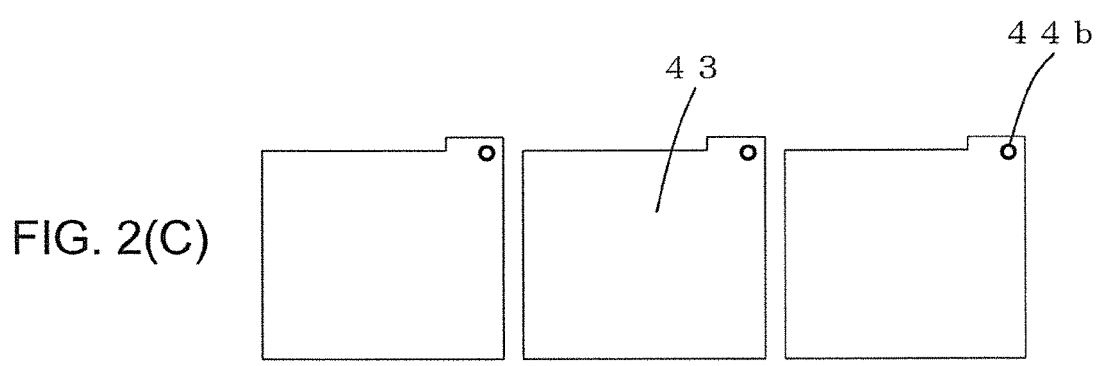
FIG. 2(c) is an explanatory diagram illustrating a capacitive coupling element included in the EBG structure.

The capacitive coupling elements 43 have, as illustrated in FIG. 2(c), at least one via 44b to be connected to the via 44a of the power supply layer pattern 42. The capacitive coupling elements 43 are disposed to be superimposed on the power supply layer electrodes 47. The capacitive coupling elements 43 are formed by an electrically conductive material such as copper. The capacitive coupling elements 43 may be formed by an electrically conductive material identical to the material of the power supply layer pattern 42.

The power supply layer electrodes 47 and the capacitive coupling elements 43 form parallel plate capacitors, and realize capacitive coupling (coupling capacitances Cs).

Figure 3:
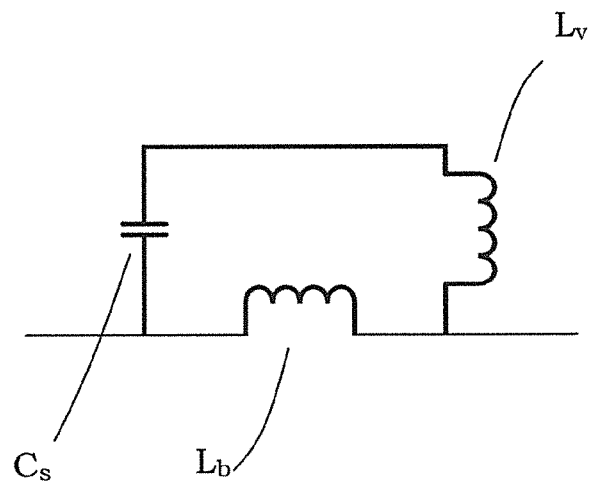
FIG. 3 is an equivalent circuit diagram of a parallel resonance circuit included in an EBG unit cell for describing a principle of downsizing achieved by providing a two-layer structure to a power supply electrode of the present disclosure.

As illustrated in FIG. 2(a), a parallel resonance circuit illustrated in FIG. 3 is formed in the EBG unit cells 41 by a series circuit configured by an inductance Lb of the branch 45 and an inductance Lv of the coupling capacitance Cs and the via 44. A prevention area where an electromagnetic wave does not propagate in a band around 2.4 GHz can be set by designing the inductance Lb and the coupling capacitance Cs so that a resonance frequency becomes 2.4 GHz. When shapes and gaps of the power supply layer electrodes 47 and the capacitive coupling elements 43 are designed so that the coupling capacitance Cs increases, the resonance frequency can be reduced, and the EBG structure 4 can be downsized.

Figure 6:
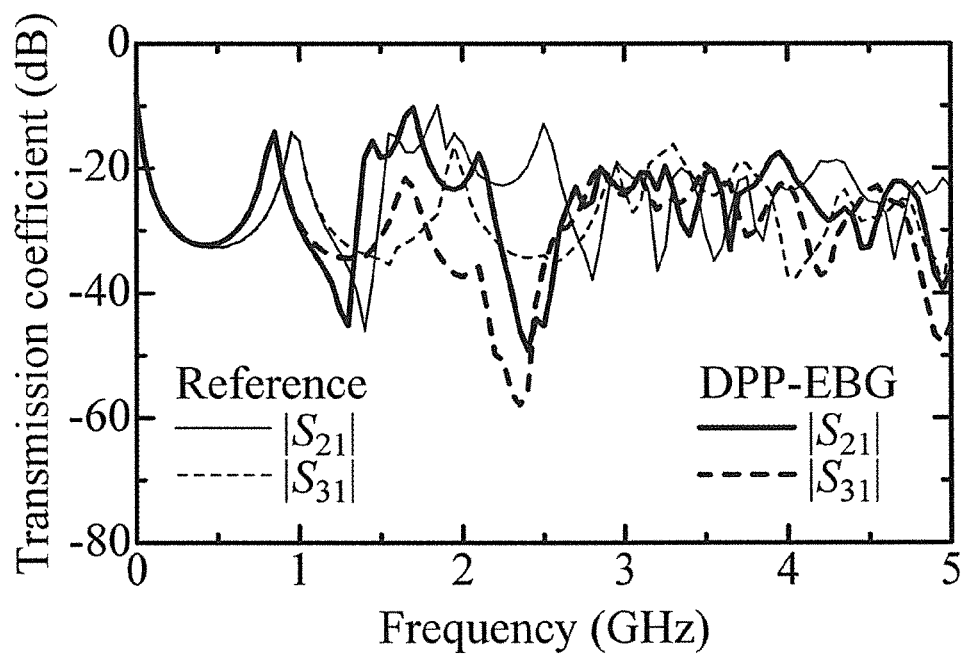
FIG. 6 is a graph illustrating the electromagnetic field simulation result using the printed wiring board of FIG. 5.

The branch 45 is for causing the direct current necessary for feeding power to flow, and is disposed in the EBG unit cells 41. The power supply layer electrodes 47 for forming the parallel plate capacitors are disposed through the slits 46. The capacitive coupling elements 43 to be counter electrodes are disposed on the power supply layer electrodes 47, respectively, so that an interlayer is provided therebetween. A thickness of the interlayer between the power supply layer electrodes 47 and the capacitive coupling elements 43 may be equal to or less than 25 μm, or may be 5 μm to 20 μm in order to sufficiently provide the coupling capacitance Cs. The branch 45 may be disposed in any positions of the EBG unit cells 41. When the capacitive coupling elements 43 are disposed so as not to be overlapped with each other, the inductance can be further increased. When electromagnetic field simulation results in FIG. 4 and FIG. 6 are obtained, a width of the branch 45 and sizes of the EBG unit cells 41 are 0.25 mm square and 2.0 mm square, respectively.

In the present disclosure, the parallel plate capacitors are formed by disposing the capacitive coupling elements 43 above the power supply layer electrodes 47 in such a manner, and thus the capacitive coupling is realized. For more details, the coupling capacitances Cs are provided in the interlayer between the power supply layer electrodes 47 and the capacitive coupling elements 43. Ends of the branch 45 and the power supply layer electrodes 47 are electrically connected and the branch 45 and the capacitive coupling elements 43 are electrically connected at the vias 44 provided to the other ends of the branch 45. The parallel resonance circuits are formed between the coupling capacitances Cs and the inductances Lb generated in the branch 45 in the EBG unit cells 41.

FIG. 3 illustrates an equivalent circuit of a parallel resonance circuit portion included in the EBG unit cells 41 illustrated in FIG. 2(a). At this time, symbol Lb represents an inductance component of the branch 45. Further, symbol Cs represents coupling capacitances of the power supply layer electrodes 47 and the capacitive coupling elements 43 obtained by dividing the power supply layer pattern 42 by the slits 46. Symbol Lv represents inductance components of paths for connecting between the power supply layer pattern 42 and the capacitive coupling elements 43 through the vias 44 (44a, 44b). The inductance components Lv depends on a thickness of the interlayer between the power supply layer electrodes 47 and the capacitive coupling elements 43, but the thickness may be ignored as a design as long as the thickness is sufficiently thin. In a case where accuracy is achieved, the equivalent circuit can be designed by taking sizes of the inductance component Lv into consideration.

Figure 4:
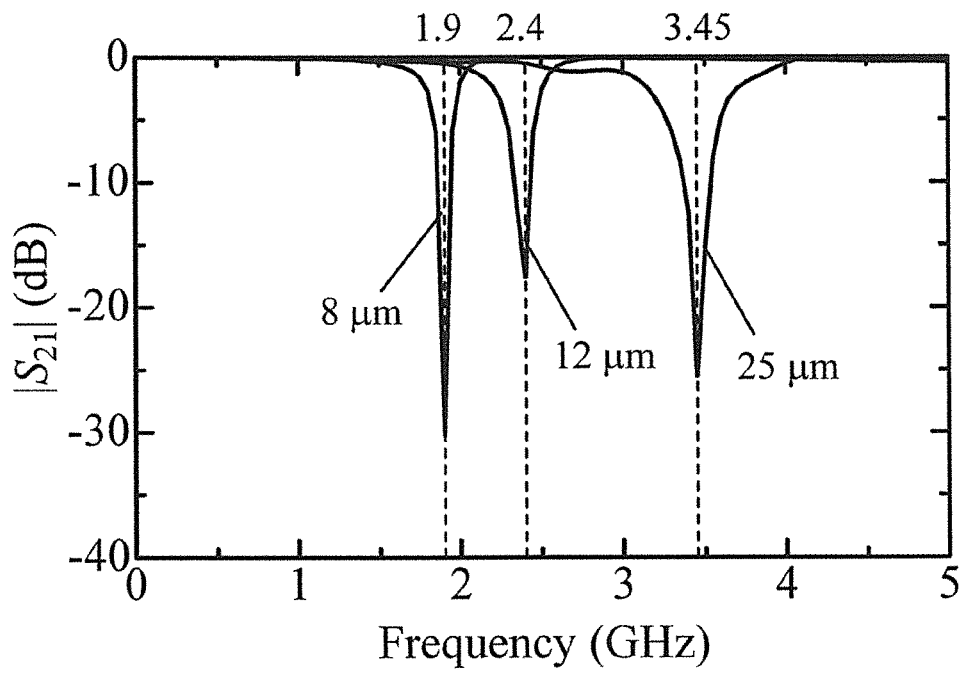
FIG. 4 is a graph illustrating an electromagnetic field simulation result indicating that a resonance frequency of the parallel resonance circuit depends on a distance between the power supply layer electrode and the capacitive coupling element.

FIG. 4 illustrates a graph obtained by checking the resonance frequencies of the parallel resonance circuits included in three EBG structures (25 μm thickness, 12 μm thickness, and 8 μm thickness) that are identical to the EBG structure illustrated in FIG. 2 but have different thicknesses of the interlayer between the power supply layer electrodes and the capacitive coupling elements, respectively, through the electromagnetic field simulation. With reference to FIG. 4, when the EBG structure of 25 μm thickness was used, the resonance frequency was 3.45 GHz.

The resonance frequency becomes 2.4 GHz and 1.9 GHz in 12 μm thickness and 8 μm thickness respectively, and as the thickness is thinner, the resonance frequency shifts to a lower frequency side. This means that as the thickness of the interlayer between the power supply layer electrodes and the capacitive coupling elements is made to be thinner, the EBG structure can be smaller.

Figure 5:
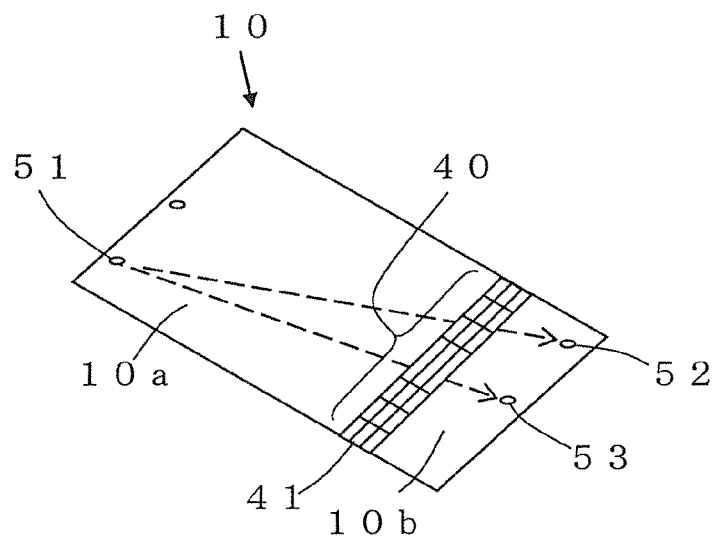
FIG. 5 is an explanatory diagram illustrating the printed wiring board for the electromagnetic field simulation for transmission characteristic according to one embodiment.

FIG. 5 is an explanatory diagram illustrating a printed wiring board 10 for a transmission characteristic simulation of according to one embodiment. In the printed wiring board 10, a port 51 is separated from ports 52, 53 by an EBG structure 40. The EBG structure 40 is configured by disposing three EBG unit cells 41 in a longitudinal direction of the printed wiring board 10 and 24 EBG unit cells 41 in a cross-sectional direction. The longitudinal direction of the printed wiring board 10 is equal to the direction along the branch where the EBG unit cells 41 are disposed. The EBG unit cells 41 have the shape equal to the shape illustrated in FIG. 2(a), a thickness of the interlayer between the power supply layer electrodes and the capacitive coupling elements is 12 μm, and the EBG unit cells 41 are 2.0 mm square. At this time, a width of the EBG structure 40 is 6.0 mm in the longitudinal direction and 48.0 mm in the cross-sectional direction. The ground layer and the insulating layer in a thickness direction of the printed wiring board 10 are omitted.

FIG. 6 illustrates a result of evaluating the transmission characteristic between the port 51 and the port 52 and between the port 51 and the port 53 through the electromagnetic field simulation using the printed wiring board 10. A thick line indicates permeability characteristic in a case where the EBG structure 40 is provided, and a thin line indicates transmission characteristic in a case (Reference) where the EBG structure 40 is not provided (a solid structure). Further, S21 in the drawing indicates between the port 51 and the port 52, and S31 indicates between the port 51 and the port 53.

With reference to FIG. 6, in the case where the EBG structure 40 is provided, the transmission amount decreases by 20 dB or more at about 2.4 GHz, and a prevention area where a high-frequency electromagnetic wave noise does not propagate is formed. This result makes it clear that as the shapes of the power supply layer pattern and the capacitive coupling element in the EBG unit cell are changed, further downsizing can be achieved or a prevention area can be formed in a different frequency range.

An EBG structure 4' according to another embodiment will be described below with reference to FIGS. 7(a) to 7(c). Members in the EBG structure 4' identical to members in the EBG structure 4 according to one embodiment are denoted by identical symbols, and detailed description thereof is omitted.

Figure 7A:
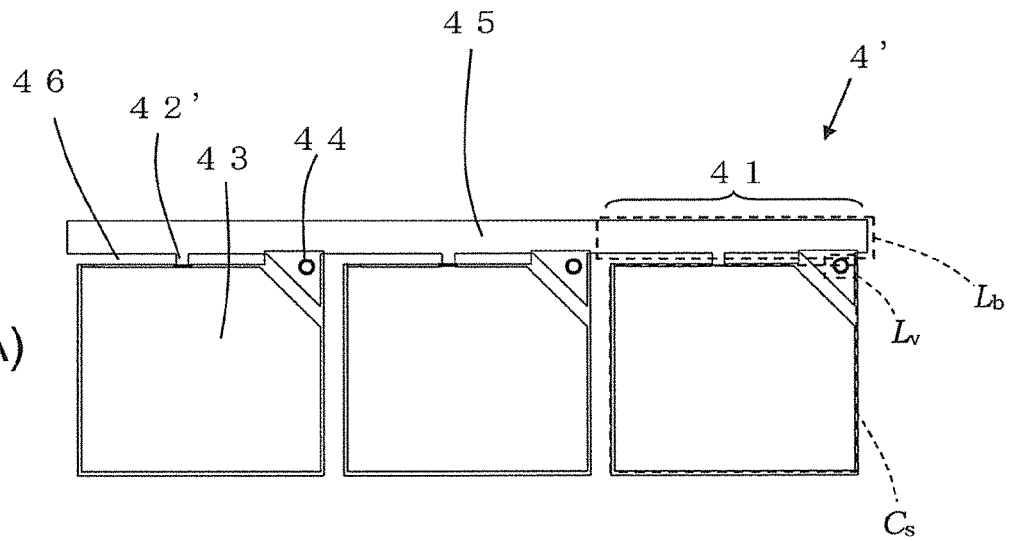
FIG. 7(a) is an explanatory diagram illustrating the EBG structure according to another embodiment.
Figure 7B:
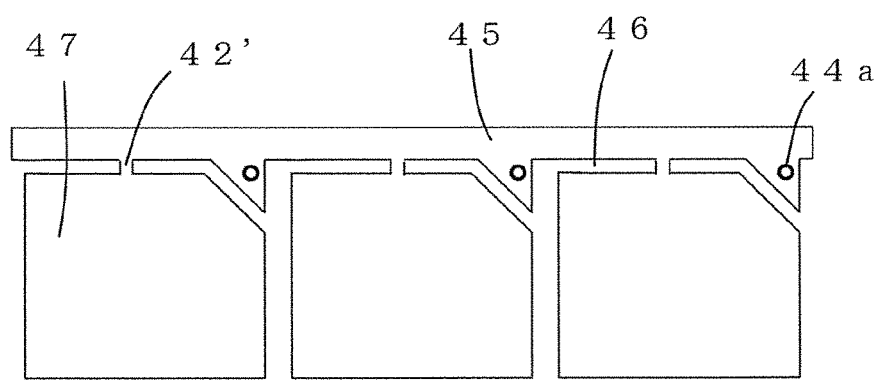
FIG. 7(b) is an explanatory diagram illustrating the power supply layer pattern included in the EBG structure.
Figure 7C:
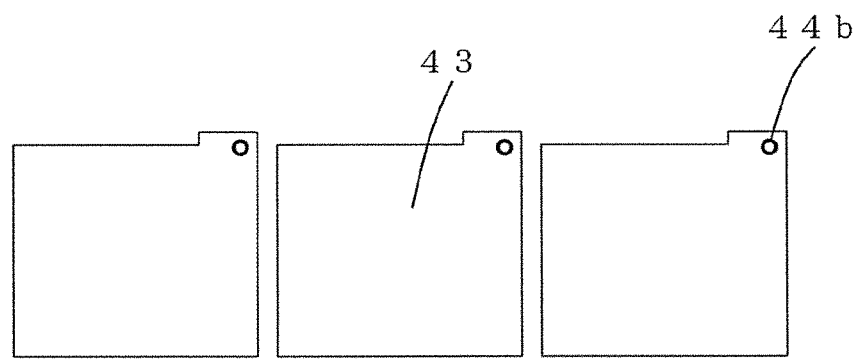
FIG. 7(c) is an explanatory diagram illustrating the capacitive coupling element included in the EBG structure.

In the EBG structure 4' according to another embodiment, a power supply layer pattern 42' is configured by, as illustrated in FIGS. 7(a) and 7(b), connecting the adjacent EBG unit cells 41 through the branch 45, and disposing the power supply layer electrodes 47 connected to the branch 45 at portions other than ends across the slits 46. Herein, "the portions other than the ends" mean portions other than the above-described "ends", namely, portions between positions of about ⅛ length of sides from ends (corners) opposite to the vias 44a and ends (corners) on the via 44a side. In the EBG structure 4', a thickness of the interlayer between the power supply layer electrodes 47 and the capacitive coupling elements 43 is 12 μm.

Figure 8:
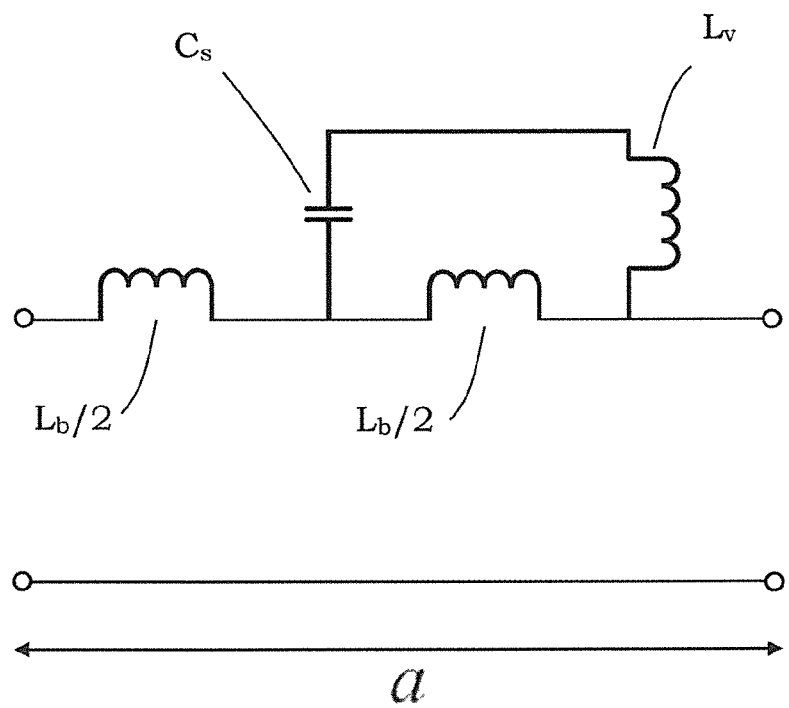
FIG. 8 illustrates an equivalent circuit of a resonance circuit portion included in EBG unit cells configuring the EBG structure illustrated in FIG. 7(a).

FIG. 8 illustrates an equivalent circuit of a parallel resonance circuit portion included in EBG unit cells 41 illustrated in FIG. 7(a). At this time, symbol $L_b/2$ represents an inductance component of the branch 45. Further, symbol Cs represents coupling capacitances of the power supply layer electrodes 47 and the capacitive coupling elements 43 obtained by dividing the power supply layer pattern 42' by the slits 46. In FIG. 7(a), since the power supply layer pattern 42' is provided with the power supply layer electrodes 47 that are connected at approximately center portions to the branch 45 across the slits 46, the inductance component is $L_b/2$. Denominator takes various values depending on connecting positions.

Figure 9:
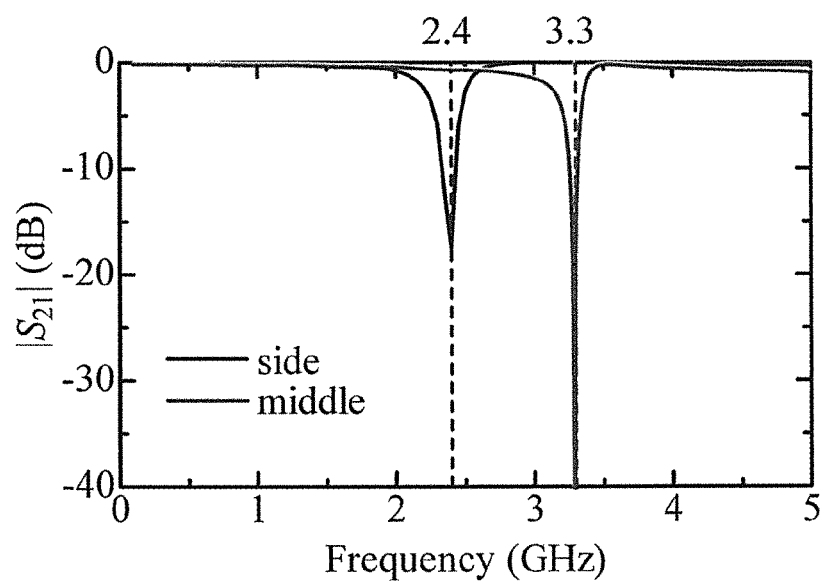
FIG. 9 is a graph illustrating an electromagnetic field simulation result for obtaining a resonance frequency of the resonance circuit in the EBG unit cells illustrated in FIG. 7(a).

FIG. 9 is a graph illustrating an electromagnetic field simulation result for obtaining a resonance frequency of the parallel resonance circuit in the EBG structure 4' illustrated in FIG. 7(a). As a result of the resonance analysis, a prevention area where electromagnetic noise propagation is suppressed at a band of 3.3 GHz can be set in the EBG structure 4'. The "end" in the graph indicates a result of the above-described EBG unit cells 41 (12 μm thickness).

According to the printed wiring board of the present disclosure, although the EBG structure does not have the via of the power supply layer and the ground, the EBG structure (the EBG unit cell) can be downsized. Further, since the EBG structure is disposed in the printed wiring board at a design stage, a mounting cost after manufacturing the printed wiring board is not necessary.

Further, like the EBG structure 4' illustrated in FIG. 7(a), a frequency to be applied can be changed by comparatively easy design change such that a connecting position is changed.

The printed wiring board of the present disclosure has been described above, the present invention is not limited to the above embodiments, and thus various upgrading and improvements can be made.

Figure 10A:
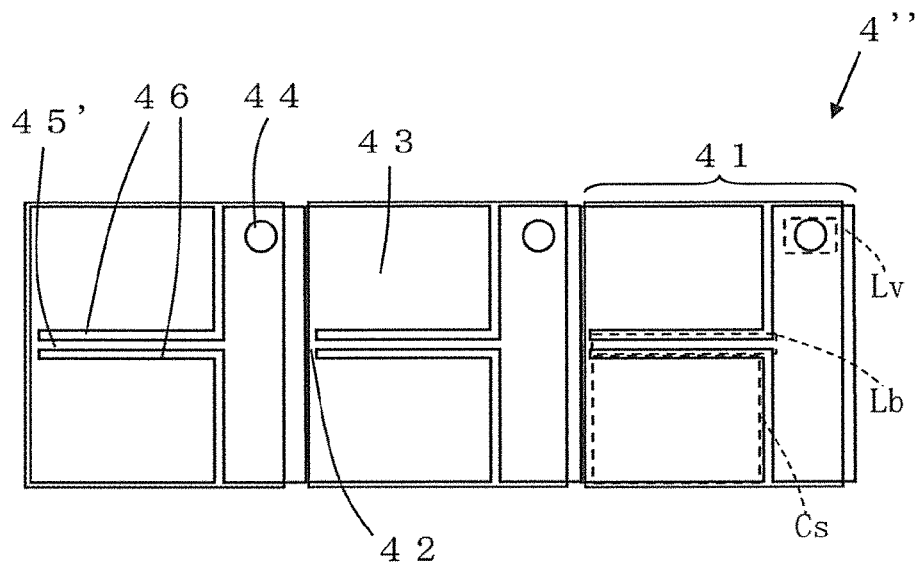
FIG. 10(a) is an explanatory diagram illustrating the EBG structure according to still another embodiment.
Figure 10B:
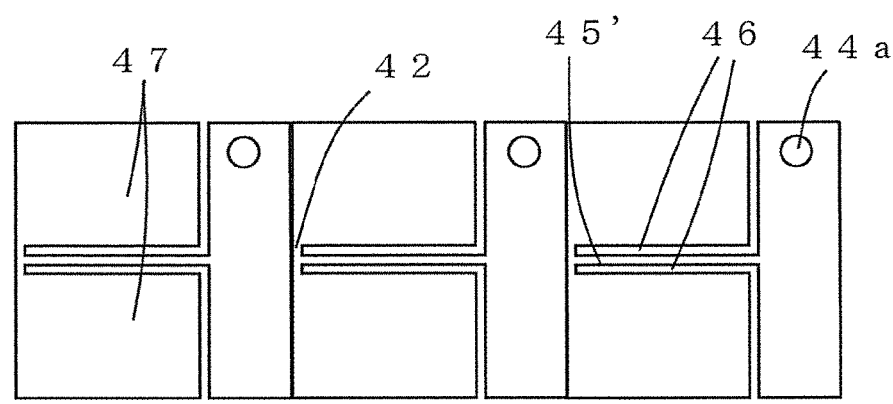
FIG. 10(b) is an explanatory diagram illustrating the power supply layer pattern included in the EBG structure.
Figure 10C:
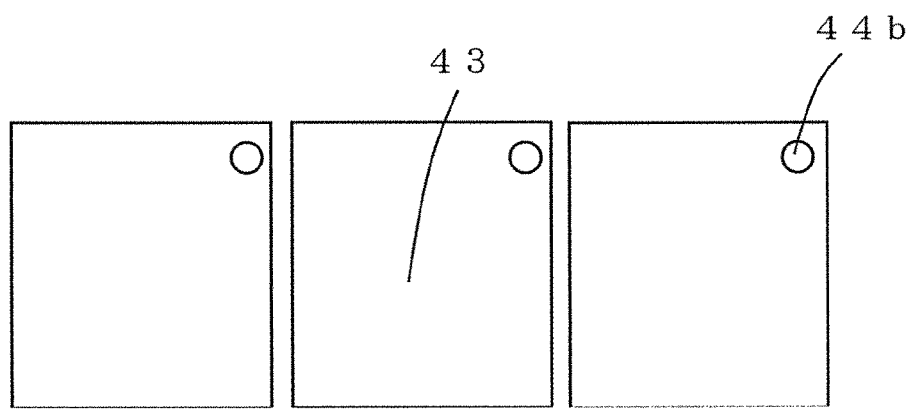
FIG. 10(c) is an explanatory diagram illustrating the capacitive coupling element included in the EBG structure.

The branch may be disposed in any position in the EBG unit cell. For example, in an EBG structure 4" according to still another embodiment illustrated in FIG. 10, a branch 45' is disposed in an approximately center portion of the EBG unit cell 41. Members in the EBG structure 4' identical to members in the EBG structure 4 according to one embodiment are denoted by identical symbols, and detailed description thereof is omitted.

REFERENCE SIGNS LIST 1, 10: printed wiring board
2: power supply layer
3: ground layer
4, 4', 4", 40: EBG structure
41: EBG unit cell
42, 42': power supply layer pattern
43: capacitive coupling element
44, 44a, 44b: via
45, 45': branch
46: slit
47: power supply layer electrode
51 to 53: port
9: insulating layer

The invention claimed is:

1. A printed wiring board comprising:
   a power supply layer;
   a ground layer;
   a power supply layer pattern formed partially on the power supply layer;
   a branch formed within the power supply layer pattern, wherein the branch is a direct-current power feeding path for connecting adjacent electromagnetic band gap (EBG) unit cells;
   a power supply layer electrode formed within the power supply layer pattern;
   a slit formed within the power supply layer pattern that partially separates the branch and the power supply layer electrode, wherein the power supply layer electrode includes a connection portion that connects the power supply layer electrode to the branch across the slit
   a capacitive coupling element that is disposed to oppose the power supply layer electrode; and
   an interlayer that is disposed between the capacitive coupling element and the power supply layer electrode,
   wherein the EBG unit cells incorporate the capacitive couple element and are arranged at regular intervals and connected to the branch in the power supply layer pattern through a via in the branch.

2. The printed wiring board according to claim 1, wherein the connection portion is located at an end of the slit.

3. The printed wiring board according to claim 1, wherein the connection portion is located at a position the power supply layer electrode other than an end of the slit.

4. The printed wiring board according to claim 1, wherein the branch is disposed at ends of the EBG unit cells.

5. The printed wiring board according to claim 1, wherein a thickness of the interlayer between the power supply layer electrode and the capacitive coupling element is equal to or less than 25 μm.

6. The printed wiring board according to claim 1, wherein the connection portion t is ⅛ of a length of a side of the power supply layer electrode.

7. The printed wiring board according to claim 1, wherein the connection portion is located between ⅛ of a length of the power supply layer electrode from a first corner of the power supply layer electrode and ⅛ of the length of the power supply layer electrode from a second corner of the power supply layer electrode.

8. The printed wiring board according to claim 1, wherein the EBG unit cells do not overlap the power supply layer electrode and the capacitive coupling element at a portion other than connecting portion.

* * * * *